United States Patent [19]
Hibbs et al.

[11] Patent Number: 5,955,222
[45] Date of Patent: Sep. 21, 1999

[54] METHOD OF MAKING A RIM-TYPE PHASE-SHIFT MASK AND MASK MANUFACTURED THEREBY

[75] Inventors: Michael Straight Hibbs, Westford; Steven John Holmes, Milton, both of Vt.; Ahmad D. Katnani, Poughkeepsie, N.Y.; Wayne Martin Moreau, Wappinger, N.Y.; Niranjan Mohanlal Patel, Wappingers Falls, N.Y.

[73] Assignee: International Business Machines Corporation, Armonk, N.Y.

[21] Appl. No.: 08/759,744

[22] Filed: Dec. 3, 1996

[51] Int. Cl.⁶ .......................................... G03F 9/00
[52] U.S. Cl. ................................. 430/5; 430/324
[58] Field of Search ............................. 430/5, 311, 313, 430/314, 324

[56] References Cited

U.S. PATENT DOCUMENTS

| | | | |
|---|---|---|---|
| 5,194,345 | 3/1993 | Rolfson | 430/5 |
| 5,300,379 | 4/1994 | Dao et al. | 430/5 |
| 5,302,477 | 4/1994 | Dao et al. | 430/5 |
| 5,348,826 | 9/1994 | Dao et al. | 430/5 |
| 5,358,827 | 10/1994 | Garofalo et al. | 430/5 |
| 5,382,483 | 1/1995 | Young | 430/5 |
| 5,384,219 | 1/1995 | Dao et al. | 430/5 |
| 5,403,682 | 4/1995 | Lin | 430/5 |
| 5,465,859 | 11/1995 | Chapple-Sokol et al. | 430/5 |
| 5,484,672 | 1/1996 | Bajuk et al. | 430/5 |

*Primary Examiner*—S. Rosasco
*Attorney, Agent, or Firm*—Schmeiser, Olsen & Watts; Mark F. Chadurjian, Esq.

[57] ABSTRACT

A method of making a rim-type phase shift mask comprising the steps of: providing a substrate having opposing first and second surfaces, the first surface being at least partially covered with a first layer of material that substantially blocks the transmission therethrough of electromagnetic radiation of the predetermined range of wavelengths; forming a plurality of openings extending through the first layer so as to expose underlying portions of the first surface of the substrate; depositing a layer of hybrid photoresist on the first layer; exposing the second surface of the substrate to electromagnetic radiation to activate the desired portions of the hybrid photoresist; developing the photoresist, thereby exposing portions underlying the resist; and etching the exposed portions of the substrate is disclosed. The hybrid photoresist material may be exposed at varying doses to alter the placement of the area that is soluble in developer solution so that the phase shifter may be placed in various areas, but is always aligned in a fixed relationship with the edge of the blocking material.

26 Claims, 13 Drawing Sheets

METHOD OF MAKING A RIM-TYPE PHASE-SHIFT MASK AND MASK MANUFACTURED THEREBY

RELATED APPLICATIONS

This application is a sister application to co-pending U.S. application Ser. No. 08/715,288, Docket No. FI9-96-055, for "Low "K" Factor Hybrid Photoresist", and Ser. No. 08/715,287, Docket No. BU9-96-047, for "Frequency Doubling Photoresist", filed Sep. 16, 1996, incorporated herein by reference.

BACKGROUND OF THE INVENTION

1. Technical Field

The present invention relates to phase-shift lithography and, more specifically, to a method of forming a rim-type phase-shift mask utilizing a hybrid photoresist material.

2. Background Art

Optical photolithography has been widely used in the semiconductor industry in connection with the formation of a wide range of structures in integrated circuit (IC) chips. As the device density on IC chips has increased, the size of the structures making up the devices has approached the wave length (around 0.25 $\mu$m) of the light used in optical photolithography processes. Optical diffraction makes it difficult to form images smaller than the wavelength of light when conventional masks and illumination techniques are used. Future density increases in IC devices may be difficult to achieve absent the development of alternative lithographic technologies.

In part as a result of these limitations of optical photolithography, X-ray lithography was developed. Due to the shorter wave length of the soft X-rays used in X-ray lithography, generally about 0.1 to 1.0 nanometers, resolution is improved significantly. With increased resolution it becomes possible to increase the device density on IC chips and/or increase chip yield. X-ray lithography has yet to be widely adopted by the semiconductor industry due, in part, to the relatively high cost of the synchrotron and other equipment used in X-ray lithography.

Phase-shift lithography was developed to enhance the range of conventional optical photolithography. Phase-shift lithography is based on opposite phase destructive interference of the waves of incident light. By shifting the phase of one region of the incident light waves 180° relative to an adjacent region of incident light waves, a sharply defined dark zone is created in the projected image of the phase shift mask. This zone defines an interface with greater edge contrast than can be achieved in the interface between a clear area and an opaque absorber in a conventional mask.

Several different phase-shift lithography techniques have been developed. One of the earliest techniques developed, as reported by Levenson et al. in the article "Improved Resolution in Photolithography with a Phase Shifting Mask," *IEEE Transactions on Electron Devices*, Vol. ED-29, Nov. 12, December, 1982, pages 18–36, involves the use of a periodic pattern arrangement in the transmission mask. Although the Levenson technique provides very sharp image contrast, it tends to be relatively difficult to design phase shift masks for the technique. Such design difficulties arise from the fact that many desired mask patterns do not have the periodic structure needed to exploit the Levenson technique.

Another phase shift lithography technique was developed, in part, to avoid the relatively complex mask fabrication requirements of the Levenson technique. This alternative phase-shift lithography process, known as self-aligned phase-shift lithography or rim-type phase-shift lithography, has been reported by Todokoro et al. in the article "Self-aligned Phase Shifting Mask for Contact Hole Fabrication," *Microelectronic Engineering*, Nov. 13, 1991, pages 131–134, and by Ishiwata et al. in the article "Fabrication of Phase-Shifting Mask," *Proceedings of the SPIE*, Vol. 1463, pages 423–33, 1991.

As illustrated in FIG. 1, rim-type phase-shift lithography involves the use of a mask 10 comprising a substrate 12 made from a material through which incident electromagnetic radiation 14 or other actinic energy used in the phase-shift lithography process will propagate. Substrate 12 has a plurality of recessed portions 16 separated by mesas 17. Sidewalls 18 define the boundary between recessed portions 16 and mesas 17. Portions of the top surfaces of mesas 17 are covered with a blocking layer 20, e.g., a layer of chromium, through which electromagnetic radiation 14 cannot be transmitted. Blocking layer 20 is formed so that edges 22 thereof are "pulled back" somewhat (i.e., are moved horizontally inwardly) relative to adjacent sidewalls 18, thereby exposing portions 24 of the top surface of substrate 12.

The height of sidewall 18, i.e., the distance between surface portion 24 and the base of recess 16, is selected so that electromagnetic radiation 14 impinging the back side of substrate 12 and propagating through portion 26 (FIG. 1) of substrate 12 exits surface portion 24 180° out of phase with electromagnetic radiation impinging the back side of the substrate and propagating through portion 28 (FIG. 1) of the substrate and exiting the bottom of recessed portion 16 adjacent sidewall 18. This phase shift occurs because substrate 12 modifies the phase of electromagnetic radiation transmitted therethrough an amount that varies as a function of the refractive index and the thickness of the substrate through which the electromagnetic radiation is transmitted. Thus, knowing the extent to which substrate 12 modifies the phase of electromagnetic radiation 14 transmitted therethrough, recessed portions 16 are formed to a depth sufficient to cause the 180° phase shift of electromagnetic radiation 14 described above. Due to destructive interference between electromagnetic radiation 14 transmitted through substrate portions 26 with radiation transmitted through substrate portions 28, a very abrupt transition in the intensity of radiation transmitted through mask 10 is formed extending substantially along, planar extensions of sidewalls 18. The graph above mask 10 in FIG. 1 illustrates the intensity of electromagnetic radiation 14 transmitted through mask 10, with nearly vertical lines 30 representing the sharp light/dark interface extending substantially along planar extensions of sidewalls 18.

It is important that the extent to which blocking layer 20 is pulled back to sidewall 18 be precisely controlled. As illustrated in FIG. 2a, if sufficient pull back of blocking layer 20 is not achieved, and hence only a relatively small surface portion 24 is exposed, substantially no destructive interference of the transmitted radiation occurs. As such, the intensity of radiation intercepting underlying resist layer 40 drops off gradually relative to planar extensions of sidewalls 18. Consequently, the patterns activated on resist layer 40 have less edge contrast than is desired. By contrast, as illustrated in FIG. 2b, if blocking layer 20 is pulled back too much relative to sidewall 18, thereby creating relatively large surface portions 24, some of the radiation propagating through the mesa 17 will not destructively interfere with radiation transmitted through adjacent recessed portions 16.

Consequently, two regions 42 (FIG. 2b) of relatively high intensity electromagnetic radiation will occur at resist layer 40. These high intensity regions 42 can result in the activation of portions of resist layer 40 that are not intended to be activated, with the result that undesired structure may be formed in the underlying wafer during subsequent process steps.

Unfortunately, implementation of rim-type phase-shift lithography has been limited due to the absence of processes for forming phase-shift masks that permit the extent of pull back of blocking layer 20 to be controlled to the extent required to avoid the above-described undesirable effects illustrated in FIGS. 2a and 2b. For example, in processes for forming rim-type phase-shift masks of the type disclosed by Ishiwata et al. as referenced above, blocking layer 20 is pulled back relative to sidewalls 18 by horizontal etching, which process tends to be difficult to control. More specifically, referring to FIGS. 3a–3d, preliminary steps in the Ishiwata et al. process produce the structure illustrated in FIG. 3a. As described above in connection with the discussion of the structure illustrated in FIG. 1, the structure illustrated in FIG. 3a comprises a quartz substrate 12 in which a plurality of recessed portions 16 are formed, each defined by sidewalls 18. The top surface of substrate 12 is covered with a chromium blocking layer 20. The process step illustrated in FIG. 3a involves covering the recessed portion 16 and blocking layer 20 with a layer of positive resist 50. Then, the backside of substrate 12 is exposed to light, indicated by arrows 52, which propagates through quartz substrate 12 and into resist layer 50, except where transmission of such light into the resist layers is blocked by chromium layer 20.

Next, portions of resist layer 50 activated by light 52 are developed and removed, as illustrated in FIG. 3b. As a result of this backside exposure and subsequent removal of activated portions of the resist layer, unactivated portions of the resist layer remain on top of chromium blocking layer 20. These unactivated portions have substantially vertical sidewalls that are substantially coplanar with the vertical sidewalls of chromium blocking layer 20 and sidewalls 18 of recessed portions 20.

Referring to FIG. 3c, the mask is then subjected to an isotropic (non-directional) plasma etching process for a period of time sufficient to remove those portions of chromium blocking layer 20 adjacent the plane of sidewalls 18 so as to expose portions 24 of the top surface substrate 12. Because blocking layer 20 is covered with resist layer 50, the blocking layer is etched almost exclusively in a horizontal direction. Hence, the process illustrated in FIGS. 3a–3d may be characterized as a horizontal etching process. The horizontal extent to which layer 20 is removed is indicated in FIGS. 3c and 3d as pull back distance "Y."

Finally, as illustrated in FIG. 3d, the remaining portions of resist layer 50 are removed.

With the Ishiwata et al. process described above, it tends to be difficult to control the extent of pull back of blocking layer 20 relative to sidewalls 18 because portions of layer 20 are removed substantially linearly with time until little or no blocking layer remains. Consequently, if the plasma etching of chrome blocking layer 20 is conducted for slightly more or less time than is required, the pull back distance Y of layer 20 can vary to an extent sufficient to result in the creation of a mask that produces the undesirable effects illustrated in FIGS. 2a and 2b and described above. Additionally, variations in distribution of the plasma of the etching process can also produce unacceptably large variations in the extent of pull back of chrome blocking layer 20 across a mask surface.

Therefore, a need exists for a method of forming a rim-type phase-shift mask in which the rim phase shifters are easily aligned with the blocking areas and are readily formed without any additional steps.

SUMMARY OF THE INVENTION

The present invention is a method of forming a rim-type phase-shift mask designed for use in a phase-shift lithography process. The method uses, as a starting material, a substrate having opposing first and second surfaces, with the first surface being covered with a first layer of material (e.g., chromium) that substantially blocks the transmission therethrough of electromagnetic radiation or other actinic energy used in the phase-shift mask lithography process (e.g., radiation having a wavelength of 248 nm). The substrate is made from a material through which a predetermined range of wavelengths of electromagnetic radiation may be transmitted.

As a first step in the method, a plurality of openings is formed in the first layer so as to expose portions of the first surface of the substrate and thereby forming a pattern in the first layer comprising radiation blocking mesas and the plurality of openings.

Next, a layer of a hybrid photoresist, i.e., a resist that acts as a positive resist at low expose doses and a negative resist at high expose doses, is deposited on the first layer and the exposed portions of the first surface of the substrate; i.e., the plurality of openings.

Then, the second surface of the substrate is exposed to actinic energy, such as ultraviolet ("UV") or i-line light sources. The actinic energy is propagated through the substrate, and is blocked by the first layer, except in the openings. The diffraction areas at the edges of each of the radiation blocking mesas allow an intermediate amount of radiation to strike those areas. Because of the nature of the hybrid photoresist, the photoresist material becomes soluble in a developer solution upon exposure to an intermediate amount of radiation. This intermediate amount, occurring in the diffraction areas, allows the resist material to be removed in those areas only. The photoresist is then developed leaving a pattern having spaces formed wherever the intermediate amount of actinic energy occurs typically at the edges of each of the radiation blocking mesas.

BRIEF DESCRIPTION OF THE DRAWINGS

For an understanding of the nature and objects of the present invention, reference should be made to the following detailed description taken in connection with the accompanying drawings wherein.

DETAILED DESCRIPTION OF THE INVENTION

Figure 1:
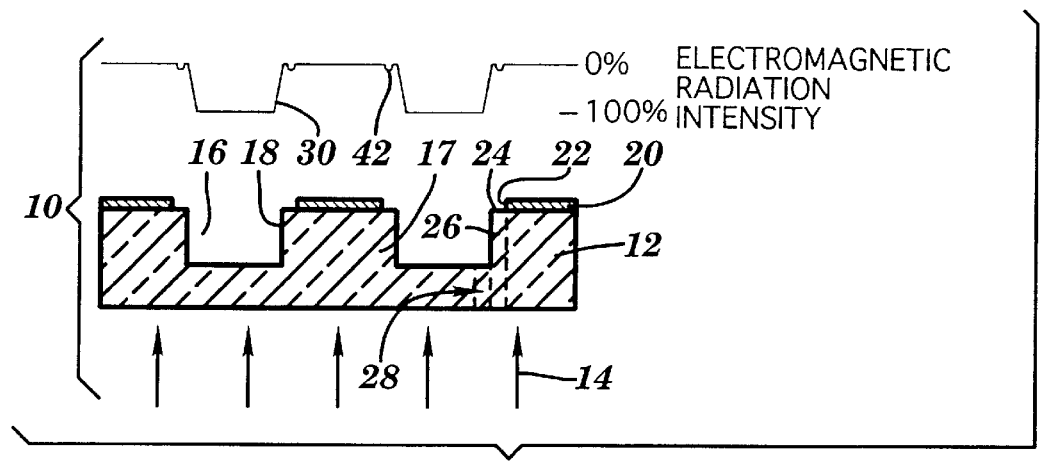
FIG. 1 is a cross-sectional view of a conventional rim-type phase-shift mask with a graphical representation of the intensity of light transmitted through the mask being provided above the mask.
Figure 2A:
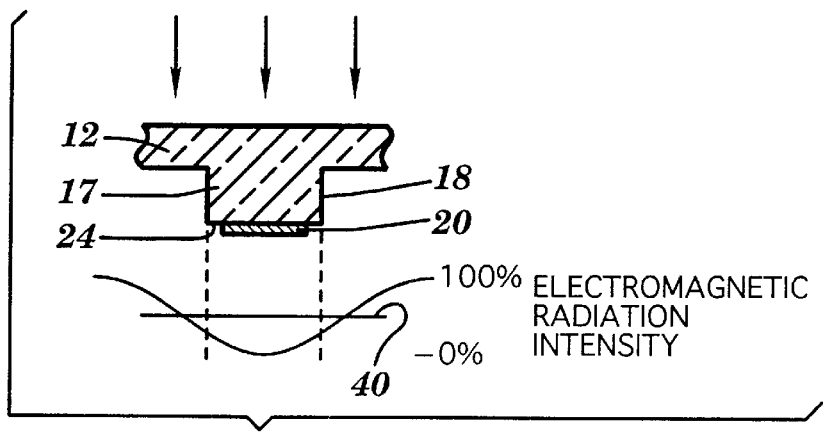
FIG. 2a is a cross-sectional view of a portion of a rim-type phase-shift mask in which the blocking layer is not pulled back a sufficient amount from the adjacent substrate sidewalls, with the intensity of light transmitted through such mask portion being illustrated beneath the mask portion.
Figure 2B:
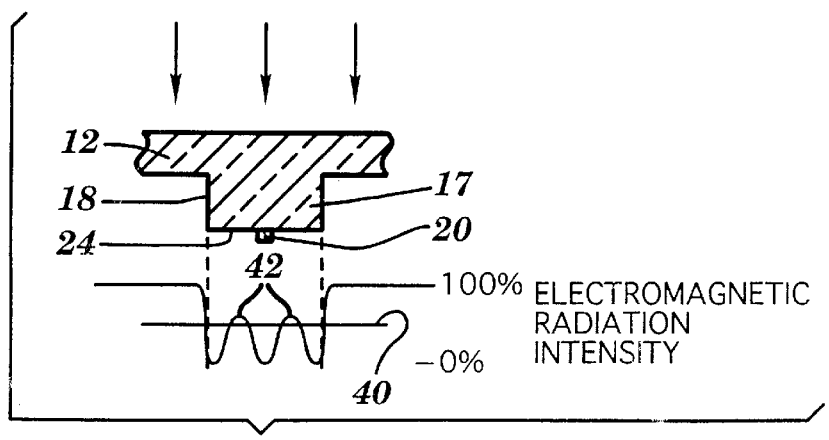
FIG. 2b is similar to FIG. 2a, except that the blocking layer is pulled back too far relative to the adjacent substrate sidewalls, with the intensity of light transmitted through the mask portion being illustrated beneath the mask portion.
Figure 3A:
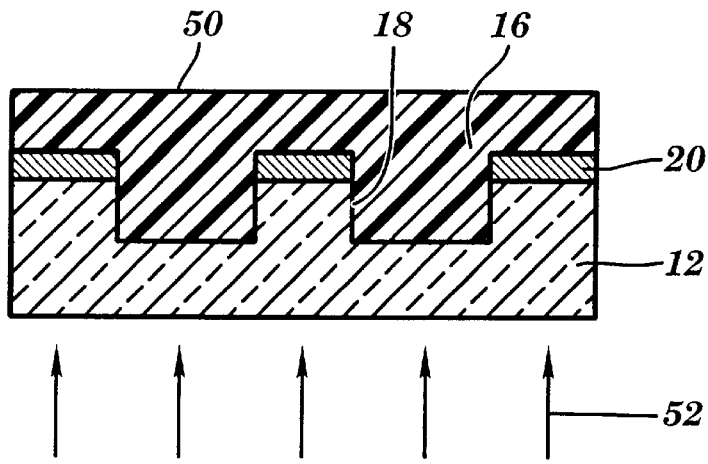
FIGS. 3a–3d illustrate the steps in a known process for forming a rim-type phase shift mask.
Figure 3B:
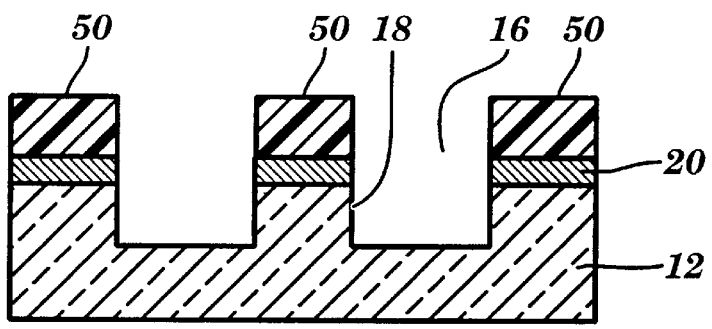
Figure 3C:
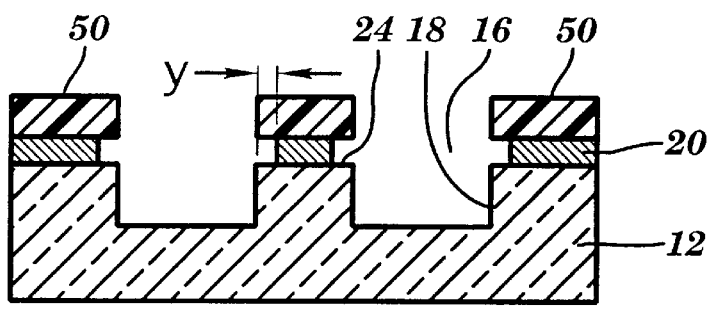
Figure 3D:
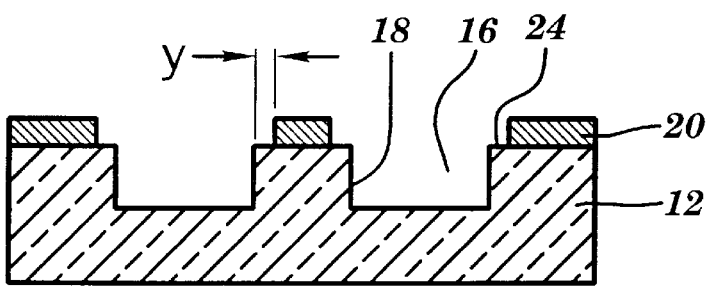
Figure 4A:
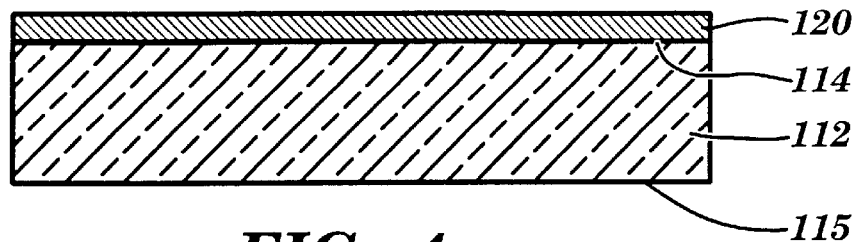
FIGS. 4a–4f illustrate the steps in the process of a preferred embodiment of the present invention.
Figure 4B:
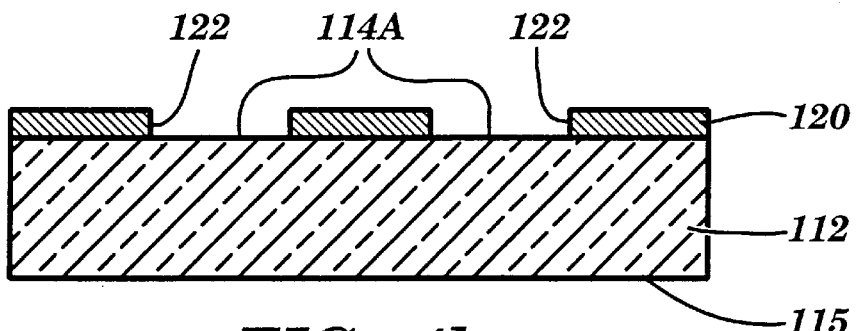
Figure 4C:
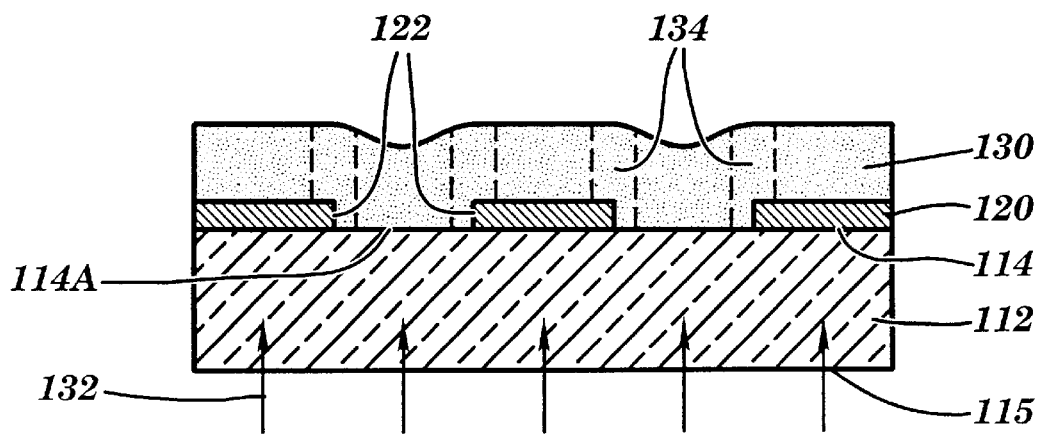
Figure 4D:
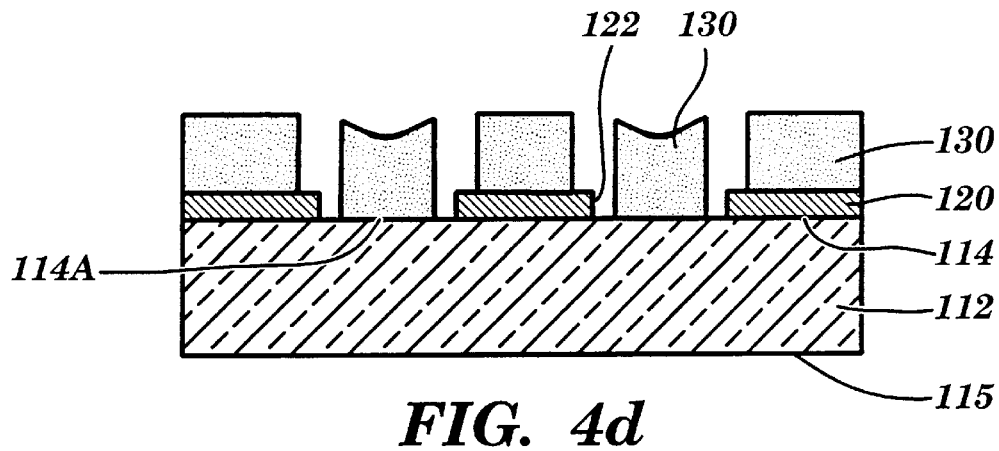
Figure 4E:
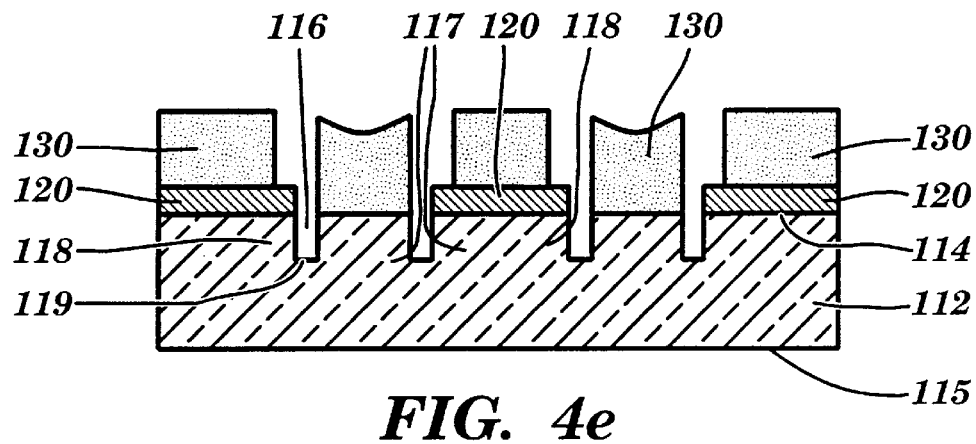
Figure 4F:
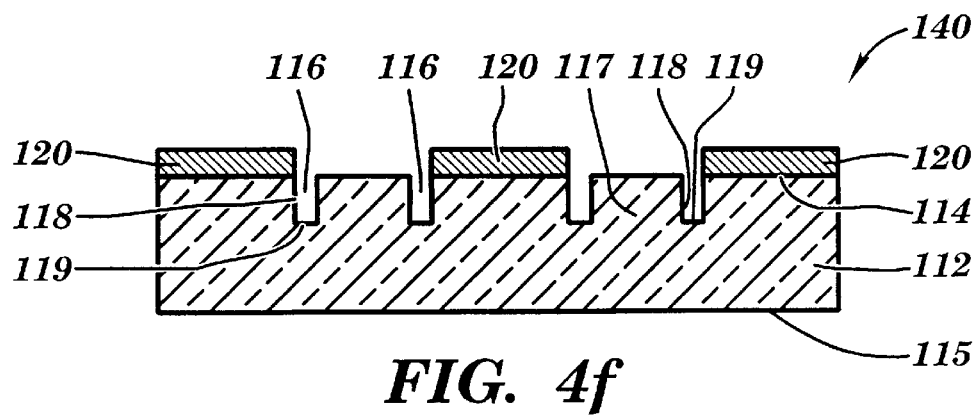

Referring to FIGS. 4a–4f, the present invention is a method of forming a rim-type phase-shift lithography mask 140 (FIG. 4f). As the first step in the method, a mask substrate 112 having a first or top surface 114 and an opposing second or bottom surface 115 is provided, as illustrated in FIG. 4a. Surfaces 114 and 115 are substantially planar and extend substantially in parallel. Substrate 112 is made from a material that will transmit electromagnetic radiation or other suitable actinic energy of the wavelength used in phase shift lithography (hereinafter "actinic radiation"), i.e., radiation typically having wavelengths in the range from about 190 to about 450 nm. Fused silica is the preferred material for substrate 112, although other materials having a suitable refractive index and other characteristics may also be used. The thickness of substrate 112 will vary based on known design considerations. However, in one embodiment of the present method, the substrate has a thickness of about 2–7 mm.

Top surface 114 is at least partially covered with a blocking layer made from a material 120 that substantially blocks the transmission therethrough of electromagnetic radiation of the predetermined range of wavelengths. Suitable materials for blocking layer 120 include those that have mechanical durability and opacity in thin layers, for example: chromium, molybdenum, aluminum, tungsten, titanium, molybdenum silicide, or carbon. Chromium is the preferred material for layer 120 due to its relatively high mechanical and chemical durability and because there is a large installed base of sophisticated chromium mask repair tools. The specific thickness of blocking layer 120 will vary as a function of the ability of the material used as the layer to block the transmission of phase-shift radiation. However, when layer 120 is made from chromium, it is preferred that the layer have a thickness ranging from about 1 nm to about 1,000 nm with a thickness of about 100 nm being preferred.

Next, as illustrated in FIG. 4b, portions of blocking layer 120 are removed using known masking and etching techniques (e.g., reactive ion etching in a chlorine and oxygen ambient or a wet etch technique) so as to form plurality of openings to expose underlying portions of the top surface 114A of substrate 112. The configuration of the pattern formed by the removal of portions of blocking layer 120 corresponds to the configuration of the pattern desired to be exposed in a resist layer on a semiconductor wafer (not shown) using a mask fabricated in accordance with the present invention. The specific dimensions of the openings formed by the removal of portions of blocking layer 120 are typically one to five times as large as the dimensions of the corresponding structure to be activated on the resist layer.

As illustrated in FIG. 4c, the next step in the process involves depositing a layer of resist 130 on the remaining portions of blocking layer 120. Resist layer 130 covers exposed top surface portions 114A of substrate 112. Resist layer 130 is a "hybrid" photoresist, i.e., a photoresist material having, simultaneously, both a positive tone and a negative tone response to exposure. With the preferred resist formulation, the positive tone response dominates at the lower exposure dose while the negative response predominates at the higher exposure dosages.

As the next step, also illustrated in FIG. 4c, resist layer 130 is exposed to electromagnetic radiation transmitted through substrate 112. This electromagnetic radiation, indicated by arrows 132 in FIG. 4c, is applied as a blanket exposure to bottom surface 115. The electromagnetic radiation propagates through substrate 112 and activates those portions of the resist layer where an intermediate amount of electromagnetic radiation, probably due to the diffraction patterns, occurs. That is, the electromagnetic radiation activates the portions of the resist layer identified as portions 134. As used herein, resist layer 130 is "activated" when it is exposed to light of sufficient intensity and for a sufficient period of time to change the chemical structure thereof so that exposure to an appropriate developer for a suitable period of time will substantially completely remove such activated portions of the resist layer while not removing portions that have been otherwise exposed, i.e., portions wherein the light reactions have been completed and portions wherein no exposure has occurred. In this preferred embodiment, the activated areas are located above the borders or vertical sidewalls of the openings in the blocking layer.

Figure 13:
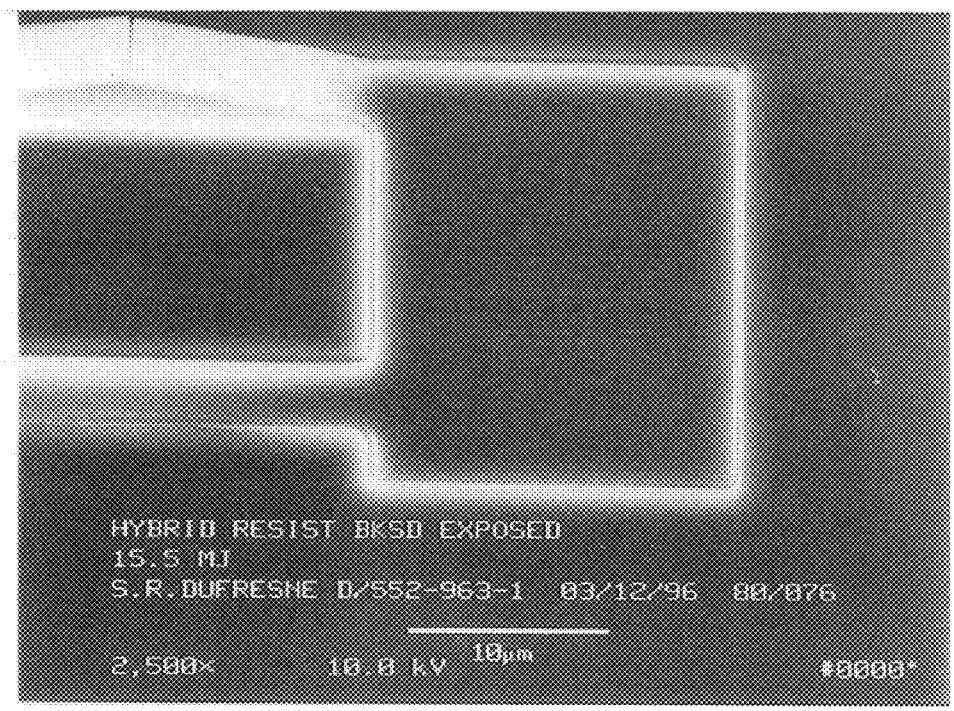
FIG. 13 is a scanning electron micrograph of a rim structure formed in accordance with the method of the present invention.

Referring to FIG. 4d, as the next step in the process, activated portions of resist layer 130 are removed by appropriate developing processes of the type well known in the art. Following such developing, surface portions and blocking portions are exposed, the centers of the activated areas are aligned substantially directly above the vertical sidewalls 122 of the first layer of blocking material 120. The portions of resist layer 130 remaining are positioned partially on top of blocking layer 120 and partially on the first surface 114A, as shown in FIG. 13. Such remaining portions of resist layer 130 are defined by substantially vertical sidewalls that are pulled back from the edges 122 a given distance, depending on the hybrid resist chosen and the exposure conditions.

As shown in FIG. 4e, recessed portions 116 are formed having substantially vertical sidewalls 118, 122 and a bottom 119. The depth of the recessed portion 116 is carefully controlled so that the electromagnetic radiation passing through the mask would be 180° out of phase with the electromagetic radiation passing through un-etched substrate features or mesas 117, as illustrated in FIG. 4f.

Any portions of resist layer 130 remaining after this final etching of the substrate 112 are removed using known processes. Upon completion of this last step in the process, the desired rim structure responsible for the phase shift phenomenon exists at the boundary between the pattern of the blocking material 120 and the un-etched substrate features 117.

The width and depth of the recessed portion 116 are selected to optimize edge contrast between the bright and dark areas created beneath mask 140 when the backside of the mask is exposed to actinic radiation.

Figure 5:
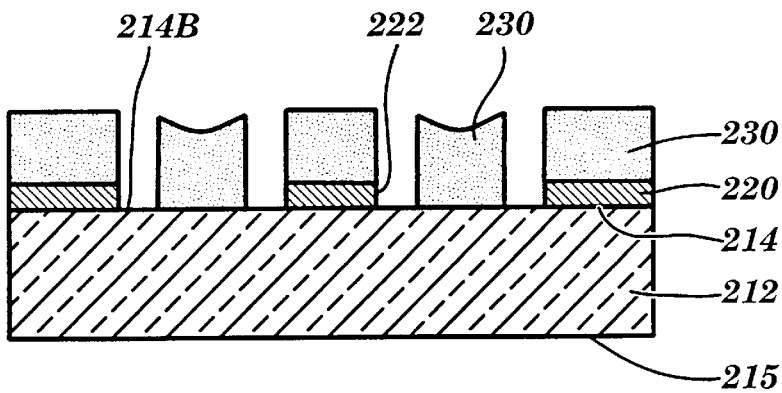
FIG. 5 illustrates an additional step in the process of an alternative embodiment of the present invention.

In a first alternative embodiment, an anti-reflective coating is used on the surface of the blocking layer 120. The anti-reflective coating reduces the scattering of stray light in the optical lithographic process, which stray light would otherwise reduce image contrast by scattering into areas that should be dark. However, during the quartz etching process, the exposed portions of the anti-reflective coating may become degraded. As shown in FIG. 5, the exposed chrome portion can be removed prior to the quartz etch, but after developing the resist, i.e., between the steps illustrated in FIGS. 4d and 4e. Thus, edge 122 is pulled back to edge 222, which is substantially planar with a vertical edge of the hybrid resist layer 130, thereby exposing surface 214B. In this manner, little to no damage is done to the anti-reflective coating during the quartz etching step, and the printed image quality is maintained.

Figure 15:
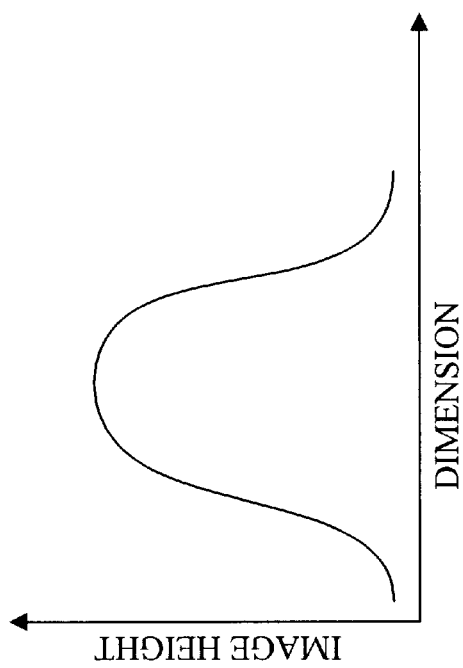
FIG. 15 is a graph depicting the line pattern when a substrate is printed with a reticle line pattern using a positive resist.
Figure 14:
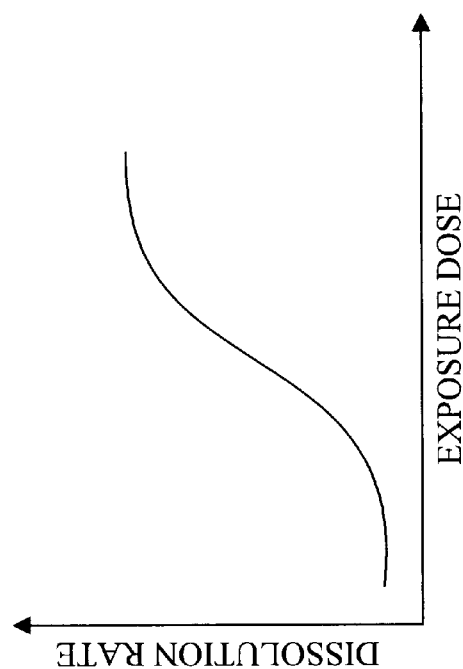
FIG. 14 is a graph depicting the solubility of positive resist as a function of exposure dose.
Figure 17:
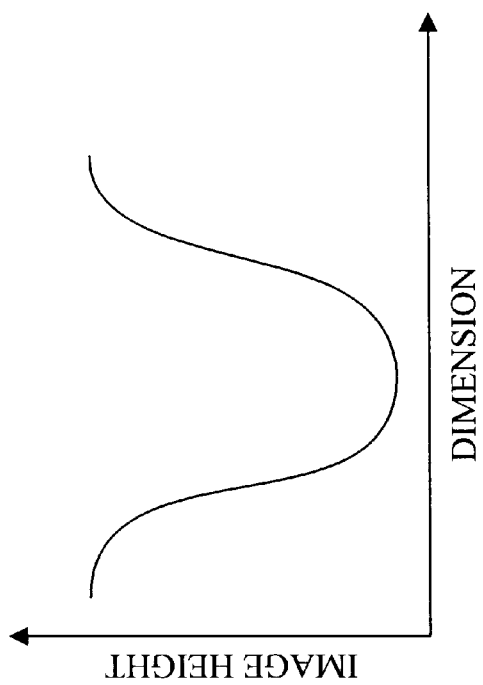
FIG. 17 is a graph depicting the line pattern when a substrate is printed with a reticle line pattern using a negative resist.
Figure 16:
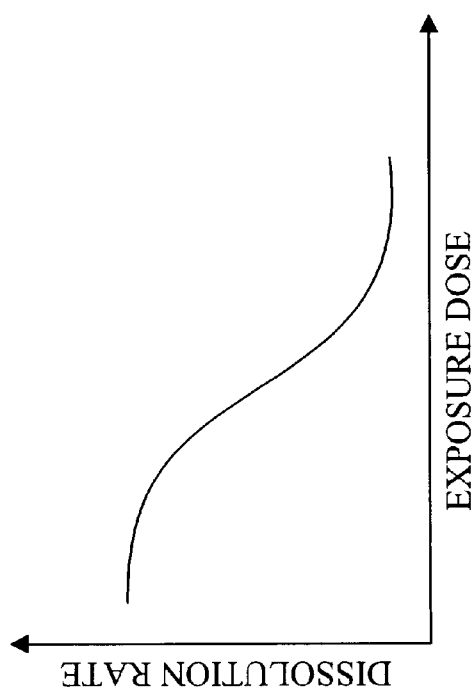
FIG. 16 is a graph depicting the solubility of negative resist as a function of exposure dose.
Figure 18:
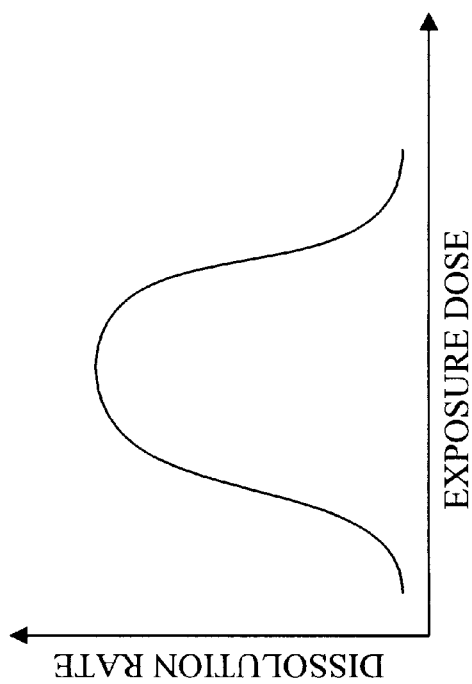
FIG. 18 is a graph depicting the solubility of a hydrid resist as a function of exposure dose.

Formation of the rim structure on rim-type phase-shift masks using the process illustrated in FIGS. 4a–4f and described above (involving a hybrid resist layer) is inherently more controllable than the prior art process described above and illustrated in FIGS. 3a–3d (involving horizontal etching of the chrome blocking layer) because exposure of this resist creates a space/line/space combination, whereas either of the conventional resists would produce only a single feature. Turning to FIG. 14, a graph is illustrated showing how, the positive resist undergoes an increase in solubility as the exposure dose is increased.
Turning to FIG. 15, the line pattern for positive resist printed with a reticle line pattern is illustrated.
On the other hand, in the negative resist system exposed areas undergo a reduction in solubility as the exposure dose is increased as illustrated in FIG. 16.
Turning to FIG. 17, the line pattern for negative resist printed with a reticle line pattern is illustrated.
For the hybrid resist of the present invention, the positive tone response causes an increase in solubility in the areas where diffraction effects have reduced the expose intensity, such as the areas near the edge of the reticle image. As the exposure dose is increased, the negative tone response predominates, causing a reduction in solubility in the more highly exposed areas. Turning to FIG. 18, the graph of the resist solubility as a function of exposure dose for hybrid resist is illustrated.

Figure 10:
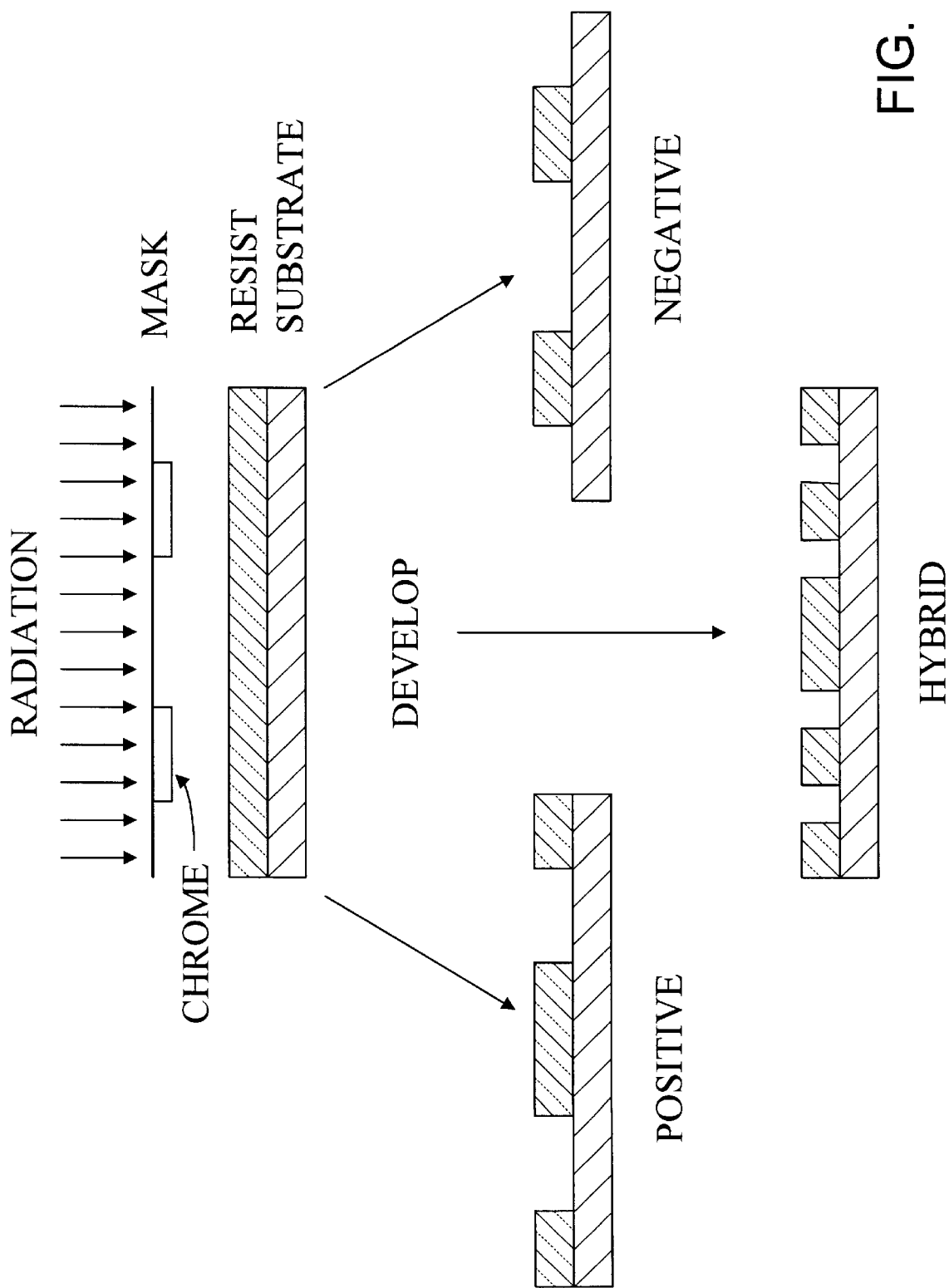
FIG. 10 is a schematic of the use of the hybrid resist of the present invention.
Figure 19:
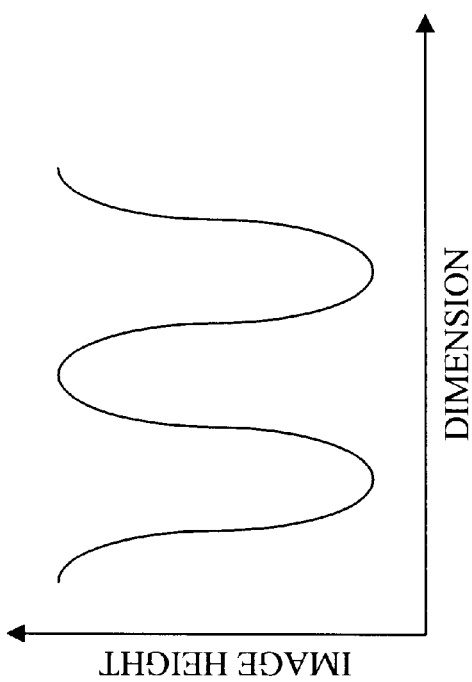
FIG. 19 is a graph of the "frequency double" space/line/space pattern attainable with a hybrid resist.

Printing a reticle line pattern onto a substrate results in the line/space/line pattern illustrated in FIG. 19.
In this manner, the aerial image is used to form a trench-like structure around the borders of each feature. FIG. 10 illustrates these salient differences between a positive resist, a negative resist, and a hybrid resist.

The hybrid resist is typically formulated using components of existing positive and negative tone resists. This includes, for example, poly(hydroxystyrene) resins which are partially modified with acid-sensitive solubility dissolution inhibiting functionalities, a cross-linker, a photo-acid generator, and, optionally, a base additive and a photosensitizer.

The resist formulations may be varied to obtain a fast positive tone reaction and a slow negative tone reaction for optimal results. Additionally, the positive tone component can be chosen such that it is relatively insensitive to post expose bake temperatures, while the negative tone portion is chosen to be more highly sensitive to post expose bake temperatures. In this way, the relative sensitivity of the positive and negative responses can be altered with bake temperatures to provide the desired imaging results.

Figure 11:
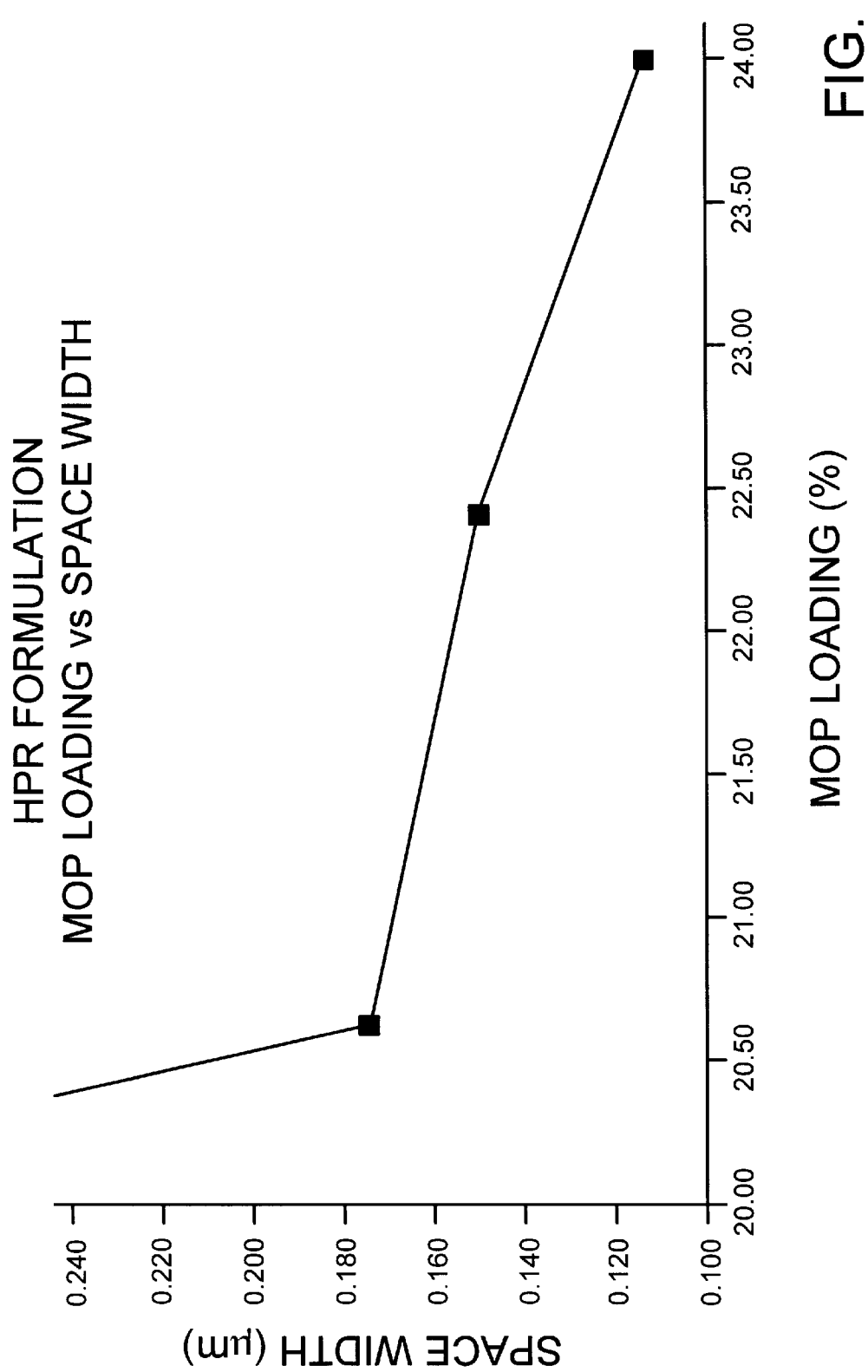
FIG. 11 is a graph showing the variation in space width in $\mu$m as a function of MOP loading using one formulation of hybrid resist of the present invention.

In addition, the resist formulations may be altered to provide space widths of different dimensions. For example, as the amount of solubility inhibitor on the poly (hydroxystyrene) resin is increased, the printed space width becomes smaller (FIG. 11). This feature allows the hybrid resist to be tailored to provide the desired width of the phase-shifting rim when used in fabricating a rim-type phase-shift mask.

The relative responses of the positive and negative tone functions of the hybrid resist can also be altered by modifying the exposure conditions. As the exposure dose is increased, the activated region of the resist is produced in darker regions of the exposed pattern. On the other hand, if the exposure dose is reduced, the activated region of resist will appear in brighter portions of the pattern. When using the hybrid resist to make a rim-type phase shift mask, the position of the rim relative to the edge of the absorber pattern can thus be adjusted over a broad range by adjusting the intensity and duration of the exposure.

Figure 6:
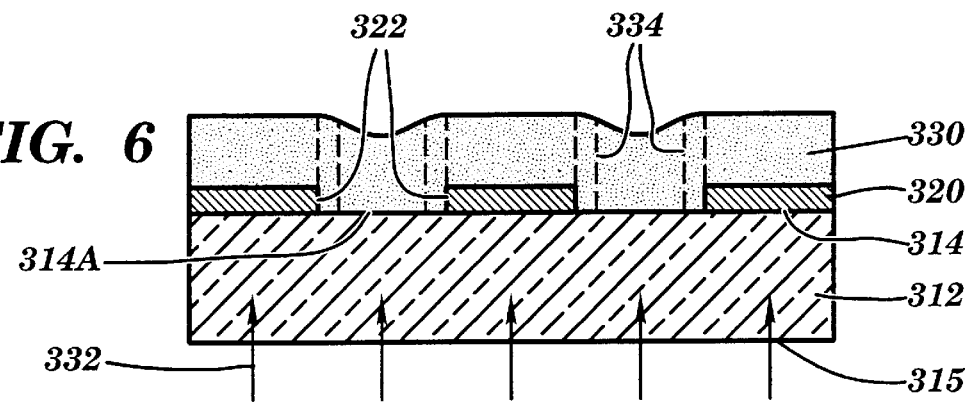
FIG. 6 illustrates an alternative step in the process of a first alternative embodiment of the present invention.

By utilizing the position shifting ability of the hybrid resist, different patterns may be obtained in the first layer on the mask. As shown in FIG. 6, the substrate 312 may be back-side 315 exposed by an actinic energy source, shown as 332. The actinic energy passes through the substrate 312 the first surface 314 to activate areas 334 of the hybrid photoresist 330. The areas 334 lie adjacent and substantially planar to the vertical edge 322 of the blocking material 320. In this manner, the phase-shifter rim is moved slightly. This allows the chrome portion to remain covered by the photoresist material 330 and, therefore, obviates the need for the additional step of trimming the blocking layer while still preventing defects from occurring in the anti-reflective coating layer.

Figure 7:
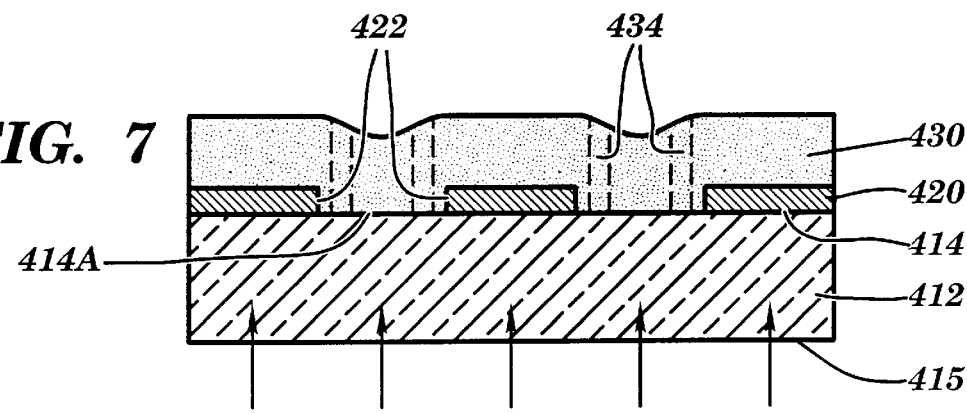
FIG. 7 illustrates an alternative step in the process of a second alternative embodiment of the present invention.

A second alternative pattern of exposure is shown in FIG. 7. In this pattern, the areas of intermediate exposure 434 lie a distance away from the vertical edge 422 of the first layer of material 420. This may be desirable when there are feature dependent image size biases arising from printing differences between areas having only isolated features versus areas having densely packed features. In the usual case, depth and width are the only adjustable parameters in forming the rim-type phase shifter. Because the depth of the trench is typically limited to the depth that will cause a 180° phase shift, width is only adjustable parameter. In the present case, the position of the phase shifter could be changed to adjust for feature dependent image size biases while still being able to control the position of the rim relative to the edge of the absorber pattern.

Figure 8:
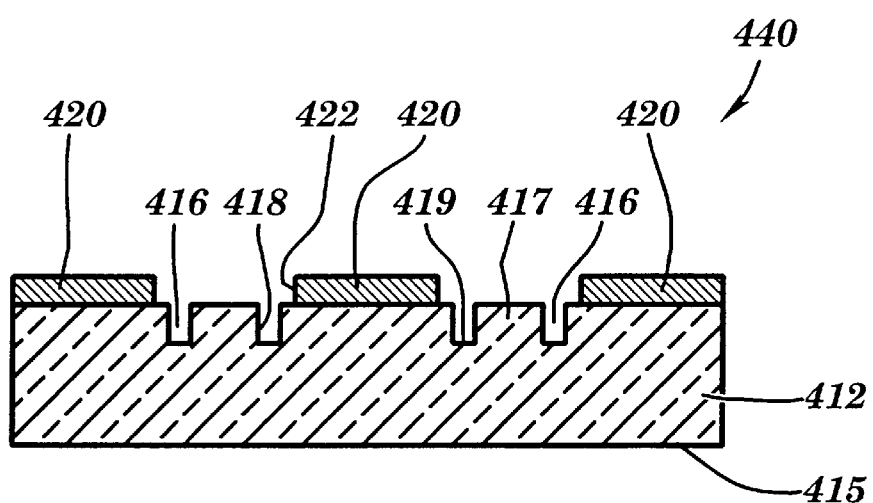
FIG. 8 is a schematic of a mask manufactured by the implementation of process of the second alternative embodiment of the present invention.

As shown in FIG. 8, recessed portions 416 are formed having substantially vertical sidewalls 418 and a bottom 419. The depth of the recessed portion 416 is carefully controlled so that the electromagnetic radiation passing through the mask would usually be 180° out of phase with the electromagnetic radiation passing through un-etched substrate features or mesas 417. However, other phase-shifts may be desirable in certain cases.

Any portions of resist layer 430 remaining after this final etching of the substrate 412 are removed using known processes. Upon completion of this last step in the process, the desired rim structure responsible for the phase shift phenomenon exists a distance away from the boundary between the pattern of the blocking material 420 and the un-etched substrate features 417.

The width and depth of the recessed portion 416 are again selected to optimize edge contrast between the bright and dark areas created beneath mask 440 when the backside of the mask is exposed to actinic radiation.

Figure 9:
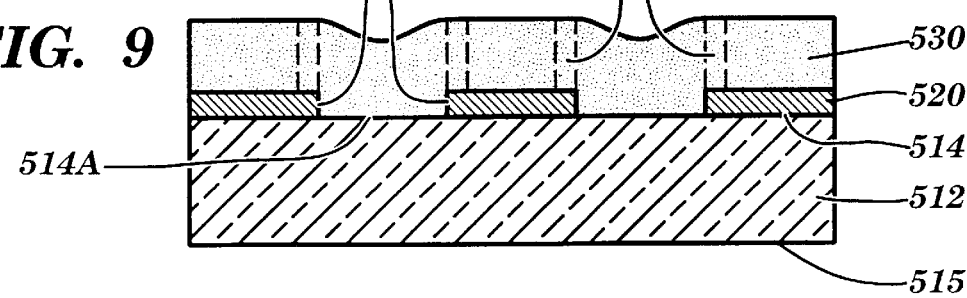
FIG. 9 illustrates an alternative step in the process of a third alternative embodiment of the present invention.

A third alternative pattern is shown in FIG. 9. In this case the resist material is chosen and processed so that the areas of intermediate exposure 534, and hence, the areas of the photoresist material that will be removed during developing, are positioned completely within the first layer of material or blocking area 520. This may be substantially planar to the edge 522 of the blocking material, or may be a distance away from the vertical edge 522 of the blocking material (not shown). This may be accomplished by exposing the backside 515 of the substrate 512 to actinic energy at a higher expose dose than would be chosen for the first embodiment of the present invention.

Figure 12:
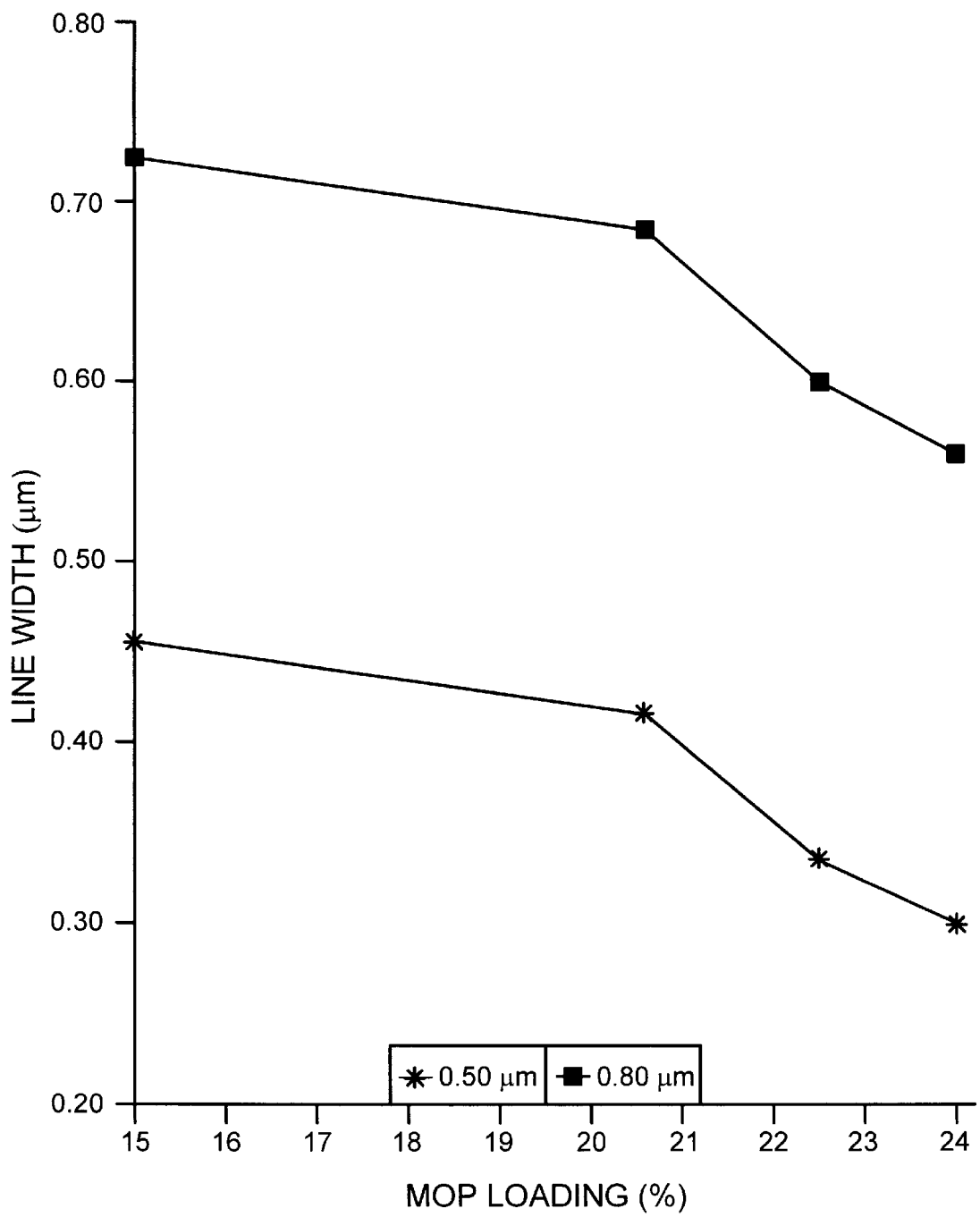
FIG. 12 is a graph showing the linewidth in nm plotted against the amount of positive tone solubility inhibitor (MOP) incorporated in a hybrid resist of the present invention.

It is possible to design the resist formulation to produce an activated region of approximately constant width over a broad range of exposure energies, when exposed as shown in FIG. 4c. By choosing an appropriate loading factor for the positive tone solubility inhibitor, one may obtain a particular print bias as shown in FIG. 12. In theory, it is quite obvious that similar variations in the photoresist response can also be brought about by making appropriate changes in concentrations and reactivities of other components as well.

The resist formulations may be varied to obtain a high photospeed positive tone reaction and a low photospeed negative tone reaction for optimal results. Additionally, the positive tone resist may be chosen so that it is insensitive to post expose bake (PEB) conditions so that the ratio of sensitivity of the positive tone to the negative tone function can be altered, thus changing the ratios of the space/line/ space combinations.

The following examples are exemplary of the frequency doubling resist composition, but are not meant to be limiting and many variations will be readily apparent to one of ordinary skill in the art.

The photoresist resins suitable for use in accordance with the invention include any of the base-soluble, long chain polymers suitable for use as a polymer resin in a photoresist formulation. Specific examples include: (i) aromatic polymers having an —OH group, e.g., polyhydroxystyrenes such as poly (4-hydroxystyrene), poly (3-hydroxystyrene), commercially available from Hoechst Celanese of Corpus Christi, Tex., novolak resins commercially available from Shipley of Marlboro, Mass., and polymers having a phenolic —OH group, e.g., phenol formaldehyde resins; (ii) polymers having an acid group, e.g., polymethacrylic acid with an ester side chain; and (iii) acrylamide group type polymers.

The polymer resin in its deprotected form, ie., once the positive tone reaction has occurred, is base soluble and compatible with developer solutions, such as aqueous solutions of metal-free ammonium hydroxide, tetramethyl ammonium hydroxide (TMAH), tetraethyl ammonium hydroxide, metal containing potassium hydroxide, and sodium metasilicate. Preferred polymer resins have an average molecular weight within the range of about 1,000 daltons to about 250,000 daltons, and most preferably within the range of about 1,000 to 25,000 daltons, to enhance its solubility in developer solutions. Examples include p-hydroxystyrene-maleic acid anhydride copolymers, polyhydroxystyrene-p-tertiarybutyl-carganatostyrene co-polymers, poly(2-hydroxystyrene), phenol-formaldehyde resins, polymethyl methacrylate-tertiary butyl methacrylate-polymethacrylic acid terpolymers, poly-4-hydroxystyrene-tertiary butyl methacrylate copolymers, poly(4-hydroxystyrene) with one or more acid labile alkyl or aryl substituents on the aromatic ring, a poly(3-hydroxystyrene) with one or more alkyl or aryl substituents on the aromatic ring, or any of these as the major number of subunits in a copolymer, such as PHM-C, commercially available from Maruzen America of New York, N.Y. The PHM-C includes both poly (hydroxystyrene) subunits and vinyl cyclohexanol subunits preferably being in the range of about 99:1 to about 50:50. The most preferred ratio is about 90 poly (hydroxystyrene) units to about 10 vinyl cyclohexanol subunits.

Crosslinking compositions are preferably tetramethoxymethyl glycouril ("Powderlink") and 2,6-bis(hydroxymethyl)-p-cresol. However, other possible crosslinking compositions include:

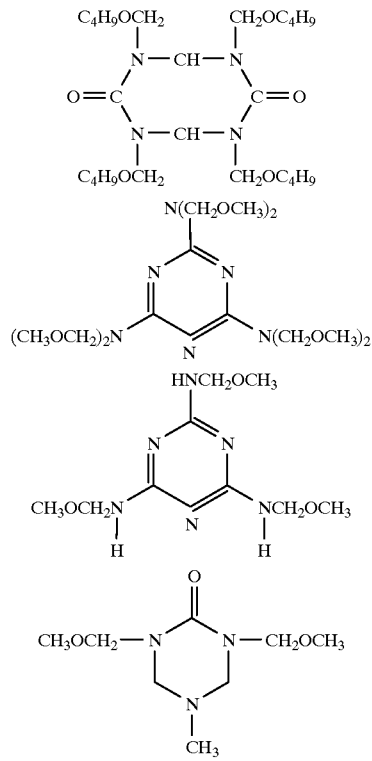

-continued

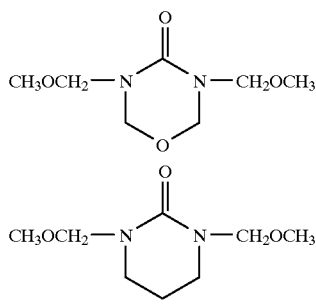

their analogs and derivatives, as can be found in Japanese Laid-Open Patent Application (Kokai) No. 1-293339, as well as etherified amino resins, for example methylated or butylated melamine resins (N-methoxymethyl- or N-butoxymethyl-melamine respectively) or methylated/butylated glycol-urils, for example of the formula:

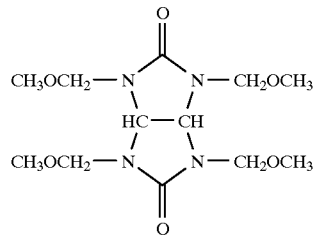

as can be found in Canadian Patent No. 1 204 547.

Photoacid generators ("PAG") include, but are not limited to: N-(trifluoromethylsulfonyloxy)-bicyclo[2.2.1]hept-5-ene-2,3-dicarboximide ("MDT"), onium salts, aromatic diazonium salts, sulfonium salts, diaryliodonium salts and sulfonic acid esters of N-hydroxyamides or -imides, as disclosed in U.S. Pat. No. 4,731,605, incorporated herein by reference. Also, a PAG that produces a weaker acid such as dodecane sulfonate of N-hydroxynaphthalimide ("DDSN") may be used.

Possible base additives include, but are not limited to: dimethylamino pyridine, 7-diethylamino-4-methyl coumarin ("Coumarin 1"), tertiary amines, proton sponge, berberine, and the polymeric amines as in the "Pluronic" or "Tetronic" series from BASF. Additionally, tetra alkyl ammonium hydroxides or cetyltrimethyl ammonium hydroxide, may be used when the PAG is an onium salt.

Examples of sensitizers that may be utilized include: chrysenes, pyrenes, fluoranthenes, anthrones, benzophenones, thioxanthones, and anthracenes, such as 9-anthracene methanol (9-AM). Additional anthracene derivative sensitizers are disclosed in U.S. Pat. No. 4,371,605, which is incorporated herein by reference. The sensitizer may include oxygen or sulfur. The preferred sensitizers will be nitrogen free, because the presence of nitrogen, e.g., an amine or phenothiazine group, tends to sequester the free acid generated during the exposure process and the formulation will lose photosensitivity.

The casting solvent is used to provide proper consistency to the entire composition so that it may be applied to the substrate surface without the layer being too thick or too thin. Sample casting solvents include: ethoxyethylpropionate ("EEP"), a combination of EEP and γ-butyrolactone ("GBL"), and propylene-glycolmonoethylether acetate (PM acetate).

In the following Example, one of each of these has been chosen, however, it is to be recognized that many other compositions may be selected for various portions of the resist, the basis of the invention lies in the fact that the hybrid resist is comprised of a negative tone component and a positive tone component, wherein the positive tone component acts at a first actinic energy level and the negative tone component acts at a second actinic energy level, the first and second actinic energy levels being separated by an intermediate range of actinic energy levels.

EXAMPLE

The hybrid resist formulation is comprised of the following components:

poly(hydroxystrene)(PHS), 10% hydrogenated, available from Maruzen America, New York, N.Y. with about 25% of the phenol groups protected with MOP, 90.8% of solids;

triphenyl sulfonium triflate, 1.3% of solids;

tetramethoxymethyl glycouril Powderlink available from Cytec, Danbury, Conn. 7.8% of solids;

tetrabutyl ammonium hydroxide base, 0.1% of solids; and sufficient proyleneglycol monomethylether (PM acetate) solvent available from Pacific Pac, Inc., Hollister, Calif. containing 350ppm FC-430, a non-ionic fluorinated alkyl surfactant ester available from available from 3M, St. Paul, Minn., form a 18.9% solids solution.

The solution was coated onto the first surface of a conventionally manufactured, chrome-on-fused silica patterned photomask, primed with hexamethyl-disilazane. The mask was soft baked at 115° Celsius (C.) for 100 seconds (sec). The resulting thickness of photoresist was approximately 0.5 μm. The back side of the mask was flood-exposed using collimated, broad band ultraviolet (UV) radiation, with a mean wavelength of approximately 250 nm, giving a total expose dose of about 20 milliJoules per square centimeter (mJ/cm$^2$). The mask was post-expose baked at 115° C. for 200 sec and developed using two 60 sec puddle develops with 0.14 Normal (N) tetramethyl ammonium hydroxide (TMAH). The pattern that resulted from this procedure consisted of trenches in the resist, surrounding each chrome feature on the mask surface, each trench being approximately 0.30 to about 0.45 μm in width. This pattern, if exposed to a dry (reactive ion) chrome etch, followed by a timed fused-silica etch, would produce the desired phase-shifting rim around each chrome pattern on the mask surface.

As those of ordinary skill in the art will appreciate, mask 140 includes other structures not illustrated in the figures or described above. For instance, a rim surrounding the periphery of the mask may be provided and a pellicle positioned in spaced relation to the mask may be used.

While the invention has been particularly shown and described with reference to preferred exemplary embodiments thereof, it will be understood by those skilled in the art that the foregoing and other changes in form and details may be made therein without departing from the spirit and scope of the invention.

Accordingly, what is claimed is:

1. A method of forming a rim-type phase-shift mask for use in a phase-shift lithography process comprising the steps of:

(a) providing a substrate having opposing first and second surfaces, the substrate being made from a material through which electromagnetic radiation of a predetermined range of wavelengths may be transmitted, the first surface being at least partially covered with a first layer of material that substantially blocks the transmission therethrough of electromagnetic radiation of the predetermined range of wavelengths;

(b) forming a plurality of openings extending through the first layer so as to expose underlying portions of the first surface of the substrate;

(c) depositing a layer of hybrid photoresist on the first layer; and (d) exposing the second surface of the substrate to electromagnetic radiation having a range of wavelengths in the predetermined range of wavelengths for a period of time sufficient to permit the electromagnetic radiation to propagate through the substrate and activate the desired portions of the hybrid photoresist.

2. The method according to claim 1, further comprising the step, following step (d), of:

(e) removing those portions of the layer of resist activated by the electromagnetic radiation.

3. The method according to claim 2, further comprising, following the step (e), of:

(f) removing those portions of the first layer not covered by the layer of resist remaining after step (e) is completed.

4. The method according to claim 3, further comprising, following the step (f), of:

(g) forming recesses of selected configuration and depth in those portions of the substrate which are exposed.

5. The method according to claim 2, further comprising, following the step (e), of:

(g) forming recesses of selected configuration and depth in those portions of the substrate which are exposed.

6. The rim-type phase-shift mask, for use in a phase-shift lithography process, produced by the method of claim 1.

7. The rim-type phase-shift mask, for use in a phase-shift lithography process, produced by the method of claim 2.

8. The rim-type phase-shift mask, for use in a phase-shift lithography process, produced by the method of claim 4.

9. The rim-type phase-shift mask, for use in a phase-shift lithography process, produced by the method of claim 5.

10. The method according to claim 1, wherein the material through which electromagnetic radiation may pass is fused silica.

11. The method according to claim 1, wherein the predetermined range of wavelengths is between 100 nm to about 1000 nm.

12. The method according to claim 1, wherein the first layer of material that substantially blocks the transmission therethrough of electromagnetic radiation of the predetermined range of wavelengths is selected from the group consisting of: chromium, molybdenum, aluminum, tungsten, titanium, molybdenum silicide and carbon.

13. The method according to claim 1, wherein the plurality of openings have vertical edges, wherein the exposure step is carried out at an exposure dose, and further comprising the step of selecting the exposure dose so as to align the desired areas of activation with the vertical edges, at a chosen location.

14. The rim-type phase-shift mask, for use in a phase-shift lithography process, produced by the method of claim 13.

15. The method according to claim 13, wherein the expose dose is selected to align the desired areas of activation so that centers of the areas are directly above the vertical edges of the plurality of openings, thereby forming exposed blocking portions and exposed substrate portions.

16. The method according to claim 15, further comprising the step of: removing the exposed blocking portion.

17. The method according to claim 13, wherein the expose dose is selected to align the desired areas of activation so that centers of the areas are located above the first surface, adjacent and substantially planar to the vertical edge of the first layer.

18. The method according to claim 13, wherein the expose dose is selected so the desired areas of activation lie a distance away from the vertical edge of the first layer of material, above the substrate.

19. The method according to claim 13, wherein the expose dose is selected so the desired areas of activation lie a distance away from the vertical edge of the first layer of material, above the first layer of material.

20. The method according to claim 1, further comprising the step, following step (b), of:

selecting a hybrid photoresist from the group consisting of: photoresists comprised of a negative tone component and a positive tone component, wherein the positive tone component acts at a first actinic energy level and the negative tone component acts at a second actinic energy level, the first and second actinic energy levels being separated by an intermediate range of actinic energy levels.

21. A rim-type phase shift mask comprising:

(a) a substrate having opposing first and second surfaces, the substrate being made from a material through which electromagnetic radiation of a predetermined range of wavelengths may be transmitted, the first surface being at least partially covered with a first layer of material that substantially blocks the transmission therethrough of electromagnetic radiation of the predetermined range of wavelengths;

(b) a plurality of openings having edges extending through the first layer so as to expose underlying portions of the first surface of the substrate; and (c) a recessed portion aligned with, but at a distance away from the edges of the openings.

22. The rim-type phase shift mask of claim 21, wherein the material through which electromagnetic radiation of a predetermined range of wavelengths may be transmitted is quartz.

23. The rim-type phase shift mask of claim 21, wherein the first layer of material that substantially blocks the transmission therethrough of electromagnetic radiation of the predetermined range of wavelengths is selected from the group consisting of: chromium, molybdenum, aluminum, tungsten, titanium, molybdenum silicide and carbon.

24. The rim-type phase shift mask of claim 21, wherein the depth of the recessed portion is selected to optimize the edge contrast between a bright and a dark area created beneath the mask when the second side of the mask is exposed to actinic radiation.

25. The rim-type phase shift mask of claim 21, wherein the distance of the recessed portion away from the edges of the openings is selected to optimize the edge contrast between a bright and a dark area created beneath the mask when the second side of the mask is exposed to actinic radiation.

26. A method of forming a rim-type phase-shift mask, for use in a phase-shift lithography process, comprising the steps of:

(a) providing a substrate having opposing first and second surfaces, the substrate being made from a material through which actinic energy of a predetermined range of wavelengths may be transmitted; wherein the material is a fused silica;

(b) applying a first layer of material that substantially blocks the transmission therethrough of actinic energy of the predetermined range of wavelengths;

(c) selectively removing portions of the first layer of material to form a plurality of openings in the first layer and to expose underlying portions of the first surface of the substrate;

(d) selecting a hybrid photoresist from the group consisting of: photoresists comprising a negative tone component and a positive tone component, wherein the positive tone component acts at a first actinic energy level and the negative tone component acts at a second actinic energy level, the first and second actinic energy levels being separated by an intermediate range of actinic energy levels;

(e) depositing a layer of the hybrid photoresist on the first layer and the underlying portions of the first surface of the substrate;

(f) exposing the second surface of the substrate to actinic energy resulting in portions of the hybrid resist being exposed to the first actinic energy level, the second actinic energy level and the intermediate range of actinic energy levels;

(g) removing those portions of the hybrid photoresist exposed to the intermediate range of actinic energy levels thereby forming exposed portions of the substrate; and (h) forming recesses of selected configuration and depth in the exposed portions of the substrate.

* * * * *